United States Patent [19]

Park et al.

[11] Patent Number: 5,796,663

[45] Date of Patent: Aug. 18, 1998

[54] ADDRESS SIGNAL STORAGE CIRCUIT OF DATA REPAIR CONTROLLER

[75] Inventors: Jong Hoon Park, Kyungki-Do; Tae Hyung Jung, Seoul, both of Rep. of Korea

[73] Assignee: LG Semicon Co., Ltd., Cheongju, Rep. of Korea

[21] Appl. No.: 764,444

[22] Filed: Dec. 12, 1996

[30] Foreign Application Priority Data

Dec. 12, 1995 [KR] Rep. of Korea ............. 1995/248723

[51] Int. Cl.[6] ........................................... G11C 7/00
[52] U.S. Cl. .................. 365/200; 365/191; 365/225.7; 365/230.06
[58] Field of Search ............... 365/200, 230.06, 365/225.7, 191

[56] References Cited

U.S. PATENT DOCUMENTS 5,610,865  3/1997  Shin et al. ............... 365/200
5,619,469  4/1997  Joo ....................... 365/200 X Primary Examiner—Do Hyun Yoo
Attorney, Agent, or Firm—Fleshner & Kim

[57] ABSTRACT

An address signal storage circuit of a data repair controller is disclosed including: a level stabilizer for stabilizing a level of an input signal to a constant level by a level control signal applied from the exterior according to the connection and disconnection of a fuse; a control signal generator for generating first and second control signals by a signal stabilized from the level stabilizer; and a signal storage portion for generating either a signal of a constant level by the first control signal generated from the control signal generator after disabled by a driving control signal applied from the exterior, or an inversion signal of the signal generated when disabled by storing an address signal of a prescribed level by the first and second control signals after enabled by the driving control signal.

11 Claims, 5 Drawing Sheets

ADDRESS SIGNAL STORAGE CIRCUIT OF DATA REPAIR CONTROLLER

BACKGROUND OF THE INVENTION

The present invention relates to an address signal storage circuit of a data repair controller. More particularly, the present invention relates to such an address signal storage circuit of a data repair controller which is disabled by an external control signal to reduce current dissipated during enabling when the data repair operation of a redundancy circuit is controlled to be disabled, and stably stores an address signal of a prescribed level according to the connection and disconnection of a fuse when the data repair operation of the redundancy circuit is controlled to be enabled.

Referring to FIG. 1, there is shown a prior art address signal storage circuit of a data repair controller. A level stabilizer 1 stabilizes an output signal level to a constant level by a level control signal LC applied from the exterior when a fuse is shorted. A control signal generator 2 generates control signals SWS1 and SWS2 for storing an address signal AD of a prescribed level by the output signal of the level stabilizer 1 according to the connection and disconnection of the fuse. A signal storage portion 3 stores the address signal AD of the prescribed level by the control signals SWS1 and SWS2 generated from the control signal generator 2.

The level stabilizer 1 includes PMOS transistors PM1 and PM2 having respective source electrodes commonly connected to a power voltage VCC terminal, respective gate electrodes respectively connected to the level control signal LC and the control signal SWS1 of the control signal generator 2 and respective drain electrodes commonly connected to one terminal of the fuse, and a PMOS condenser MC having drain and source electrodes commonly connected to the power voltage VCC terminal.

The control signal generator 2 includes an inverter I1 for generating the control signal SWS1 by inverting the output signal of the level stabilizer 1 according to the connection and disconnection of the fuse, and an inverter I2 for generating the control signal SWS2 by inverting the control signal SWS1 generated from the inverter I1.

The signal storage portion 3 has a transmission gate TG1 switched by the control signals SWS1 and SWS2 generated from the inverters I1 and I2 of the control signal generator 2 to generate the address signal AD of the prescribed level, and a transmission gate TG2 switched by the control signals SWS1 and SWS2 to generate an inverted address signal which has passed through an inverter I3.

Referring to FIG. 2, another prior art address storage circuit of the data repair controller is shown. Level stabilizers 10 and 20 stabilize an input signal level to a constant level when fuses FUSE1 and FUSE2 are in the connected state. A signal storage portion 30 generates a signal of a constant level irrespective of address input signals Ai and /Ai after disabled by signals stabilized by the level stabilizers 10 and 20 when the fuses FUSE1 and FUSE2 are in the connected state, and generates an inversion signal of the signal generated when disabled by storing the input address signal Ai of a prescribed level after enabled by an input signal when the connected state of the fuses FUSE1 and FUSE2 is different.

The level stabilizer 10 includes an NMOS transistor NM1 having a drain electrode connected to one terminal of the fuse FUSE1 and an input terminal of an inverter I10, a gate electrode connected to an output terminal of the inverter I10, and a source electrode connected to a ground voltage VSS terminal.

The level stabilizer 20 includes an NMOS transistor NM6 having a drain electrode connected to one terminal of the fuse FUSE2 and an input terminal of an inverter I11, a gate electrode connected to an output terminal of the inverter I11, and a source electrode connected to the ground voltage VSS terminal.

In the signal storage portion 30, a PMOS transistor PM1 has a source electrode commonly connected to the power voltage VCC terminal and the other terminals of the fuses FUSE1 and FUSE2, and a gate electrode connected to the drain electrode of the NMOS transistor NM1 of the level stabilizer 10. A PMOS transistor PM2 has a source electrode connected to a drain electrode of the PMOS transistor PM1, and a gate electrode connected to the address signal Ai. An NMOS transistor NM2 has a drain electrode commonly connected to a drain electrode of the PMOS transistor PM2 and an output signal OS, and a gate electrode connected to the inverted address signal /Ai. An NMOS transistor NM3 has a drain electrode connected to a source electrode of the NMOS transistor NM2, a gate electrode connected to the gate electrode of the PMOS transistor PM1, and a source electrode connected to the ground voltage VSS terminal. A PMOS transistor PM3 has a source electrode connected to the source electrode of the PMOS transistor PM1, and a gate electrode connected to the drain electrode of the NMOS transistor NM6 of the level stabilizer 20. A PMOS transistor PM4 has a source electrode connected to a drain electrode of the PMOS transistor PM3, and a gate electrode connected to the inverted address signal /Ai. An NMOS transistor NM4 has a drain electrode commonly connected to a drain electrode of the PMOS transistor PM4 and the output signal OS, and a gate electrode connected to the address signal Ai. An NMOS transistor NM5 has a drain electrode connected to a source electrode of the NMOS transistor NM4, a gate electrode connected to the gate electrode of the PMOS transistor PM3, and a source electrode connected to the ground voltage VSS terminal.

The operation of the address signal storage circuits of the data repair controller constructed in the above-mentioned way will now be described.

Referring again to FIG. 1, it is assumed that an output signal FOUT of the signal storage portion 3 should be set to logic "high" in order to control the data repair operation of a redundancy circuit (not shown) to be disabled. The fuse is externally controlled to a connected state.

Since the fuse is in the connected state, the ground voltage VSS is applied to the node N1 and the node N1 is set to logic "low". The inverter I1 of the control signal generator 2 generates the control signal SWS1 of logic "high", and the inverter I2 generates the control signal SWS2 of logic "low". The transmission gate TG1 of the signal storage portion 3 receives the control signal SWS2 of logic "low" generated from the inverter I2 and the control signal SWS1 of the logic "high" generated from the inverter I1 through PMOS and NMOS terminals, respectively. Therefore, the transmission gate TG1 is turned on and generates the input address signal AD of logic "high". Thus, the redundancy circuit is disabled by the address signal AD of logic "high" generated from the transmission gate TG1 of the signal storage portion 3. Consequently, in order to control the data repair operation of the redundancy circuit to be disabled, the signal storage portion 3 stores the address signal AD of logic "high".

On the other hand, in order to control the data repair operation of the redundancy circuit to be enabled, it is assumed that the output signal FOUT of the signal storage portion 3 should be set to logic "low". If the fuse is in the connected state, the transmission gate TG1 of the signal storage portion 3 is turned on by the control signals SWS1 and SWS2 generated from the control signal generator 2, as described above, and generates the input address signal AD of logic "low".

If the fuse is shorted, the node N1 is set to logic "high" by the PMOS transistors PM1 and PM2 and the PMOS condenser MC. The inverter I1 generates the control signal SWS1 of logic "low", and the inverter I2 generates the control signal SWS2 of logic "high". The transmission gate TG2 of the signal storage portion 3 receives through a PMOS terminal the control signal SWS1 of logic "low" generated from the inverter I1 and through an NMOS terminal the control signal SWS2 of logic "high" generated from the inverter I2. Therefore, the transmission gate TG2 is turned on and generates the output signal FOUT of logic "low" which inverts the address signal AD of logic "high" by the inverter I3.

Consequently, in order to control the data repair operation of the redundancy circuit to be disabled, the signal storage portion 3 stores the input address signal AD of logic "high" while the fuse is connected. In order to control the data repair operation of the redundancy circuit to be enabled, the signal storage portion 3 stores the input address signal AD of logic "low" while the fuse is connected, and stores the input address signal AD of logic "high" while the fuse is shorted.

Referring now to FIG. 2, in order to control the data repair operation of the redundancy circuit to be disabled, the fusses FUSE1 and FUSE2 are controlled to the connected state. Since the fuse FUSE1 is in the connected state, a node N1 is set to logic "high", and the logic "high" voltage across the node N1 is applied to the gate electrode of the NMOS transistor NM1 through the inverter I10. Therefore, the NMOS transistor NM1 is turned off and that node N1 is in the stabilized logic "high" voltage. Moreover, a node N2 is set to logic "high" since the fuse FUSE2 is in the connected state, and the logic "high" voltage across the node N2 is applied to the gate of the NMOS transistor NM6 through the inverter I11. Hence, the NMOS transistor NM6 is turned off and the that node N2 is in the stabilized logic "high" voltage.

The logic "high" voltages across the nodes N1 and N2 are applied to the gate electrodes of the NMOS transistors NM3 and NM5, respectively. The NMOS transistors NM3 and NM5 are turned on and the output signal OS is set to logic "low" irrespective of the input address signals Ai and /Ai. Thus, the redundancy circuit is disabled by the output signal of logic "low" generated from the signal storage portion 30.

In order to control the repair operation of the redundancy circuit to be enabled, if the fuse FUSE1 is shorted and the fuse FUSE2 is connected, the node N1 is set to logic "low" and the node N2 is set to logic "high". Then the signal storage portion 30 receives the logic "low" voltage across the node N1 and the logic "high" voltage across the node N2 and stores the input address signal Ai of logic "low", thereby generating the output signal OS of logic "high".

That is, the PMOS transistor PM1 and the NMOS transistor NM3 of the signal storage portion 30 receive the logic "low" voltage across the node N1 through the respective gate electrodes, and are turned on and turned off, respectively. The PMOS transistor PM2 and the NMOS transistor NM4 receive the address signal Ai of logic "low" through the respective gate electrodes, and are turned on and turned off, respectively. The NMOS transistor NM2 and the PMOS transistor PM4 receive the inverted address signal /Ai of logic "high" through the respective gate electrodes, and are turned on and turned off, respectively. The PMOS transistor PM3 and the NMOS transistor NM5 receive the logic "high" voltage across the node N2 through the respective gate electrodes, and are turned off and on, respectively. Therefore, the signal storage portion 30 generates the output signal OS of logic "high". The redundancy circuit is enabled by the output signal OS of logic "high" and carries out the data repair operation.

In order to control the repair operation of the redundancy circuit to be enabled, if the fuse FUSE1 is in the connected state and the fuse FUSE2 is in the shorted state, the node N1 is set to logic "high" and the node N2 is set to logic "low". Then the signal storage portion 30 receiving the logic "high" voltage across the node N1 and the logic "low" voltage across the node N2 stores the address signal Ai of logic "high" and generates the output signal OS of logic "high".

In more detail, the PMOS transistor PM1 and the NMOS transistor NM3 receiving the logic "high" voltage across the node N1 through the respective gate electrodes are turned off and turned on, respectively. The PMOS transistor PM2 and the NMOS transistor NM4 receiving the address signal Ai of logic "high" through the respective gate electrodes are turned off and turned on, respectively. The NMOS transistor NM2 and the PMOS transistor PM4 receiving the inverted address signal /Ai of logic "low" through the respective gate electrodes are turned off and turned on, respectively. The PMOS transistor PM3 and the NMOS transistor NM5 receiving the logic "low" voltage across the node N2 through the respective gate electrodes are turned on and turned off, respectively. Therefore, the output signal OS of logic "high" is generated.

As a result, in order to enable the data repair operation of the redundancy circuit, if the fuse FUSE1 is in the shorted state and the fuse FUSE2 is in the connected state, the address signal Ai of logic "low" is stored. If the fuse FUSE1 is in the connected state and the fuse FUSE2 is in the shorted state, the address signal Ai of logic "high" is stored.

However, since the prior art address storage circuit of the data repair controller should store the address signal of the prescribed level in order to control the data repair operation to be disabled, as shown in FIG. 1, the current is dissipated by such operation and the power consumption increases. Further, as shown in FIG. 2, since the address signal is stored using two fuses, the area occupied by the address storage circuit increases. If both fusses are shorted, since the logic "low" level across the shorted nodes is not stabilized, the address storage circuit operates unstably and another level stabilizer is needed.

SUMMARY OF THE INVENTION

It is an object of the present invention to provide an address signal storage circuit of a data repair controller which is disabled by an external control signal to reduce current dissipated during enabling when the data repair operation of a redundancy circuit is controlled to be disabled, and stably stores an address signal of a prescribed level according to the connection and disconnection of a fuse when the data repair operation of the redundancy circuit is controlled to be enabled.

According to one aspect of the present invention, an address signal storage circuit of a data repair controller includes: a level stabilizer for stabilizing a level of an input signal to a constant level by a level control signal applied from the exterior according to the connection and disconnection of a fuse; a control signal generator for generating first and second control signals by a signal stabilized from the level stabilizer; and a signal storage portion for generating either a signal of a constant level by the first control signal generated from the control signal generator after disabled by a driving control signal applied from the exterior, or an inversion signal of the signal generated when disabled by storing an address signal of a prescribed level by the first and second control signals after enabled by the driving control signal.

According to another aspect of the present invention, an address signal storage circuit of a data repair controller includes a signal storage portion for generating either a signal of a constant level by a level control signal applied from the exterior irrespective of an input address signal after disabled by a driving control signal applied from the exterior, or an inversion signal of the signal generated when disabled by storing the address signal of a prescribed level by the level control signal and an inverted level control signal after enabled by the driving control signal.

BRIEF DESCRIPTION OF THE ATTACHED DRAWINGS

DETAILED DESCRIPTION OF PREFERRED EMBODIMENT

Figure 1:
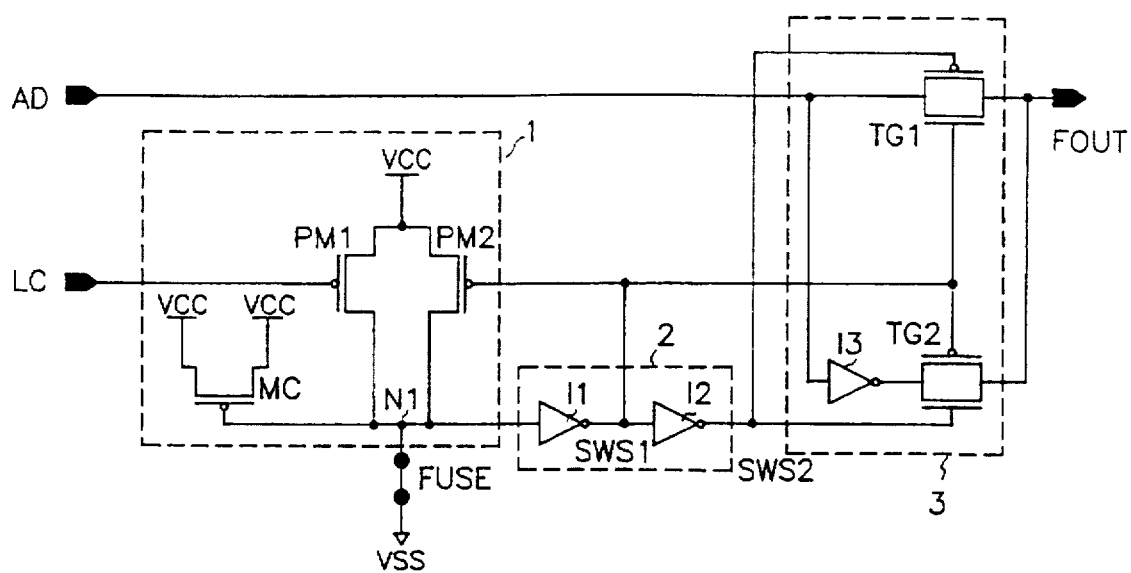
FIG. 1 is a circuit diagram of a prior art address signal storage circuit of a data repair controller.
Figure 2:
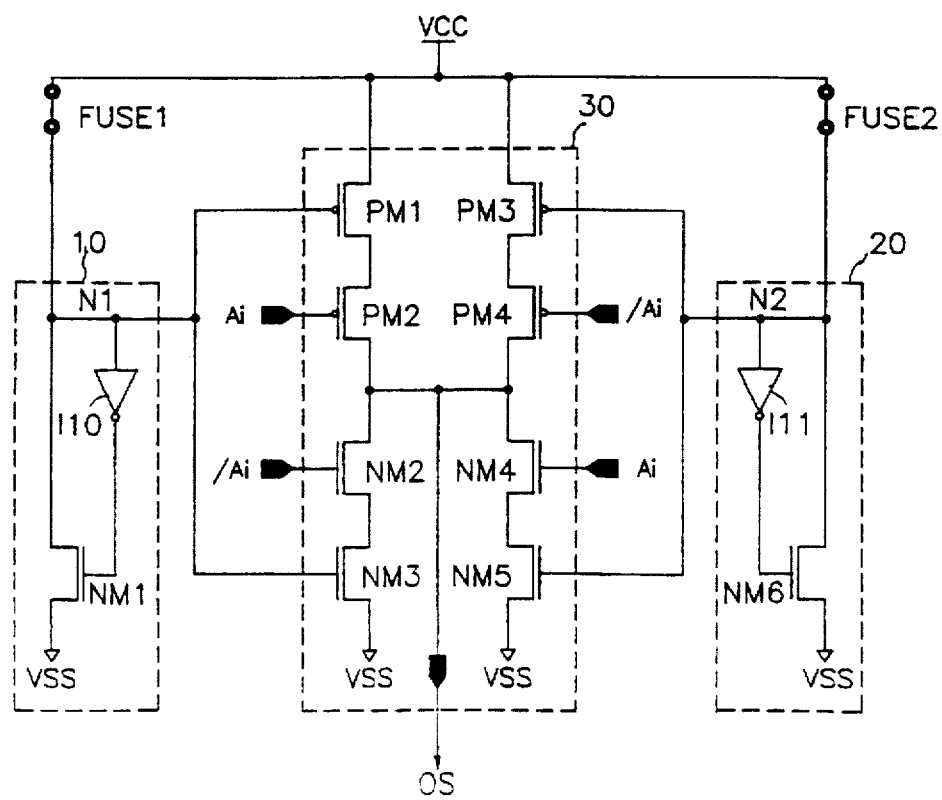
FIG. 2 is a circuit diagram of another prior art address signal storage circuit of a data repair controller.
Figure 3:
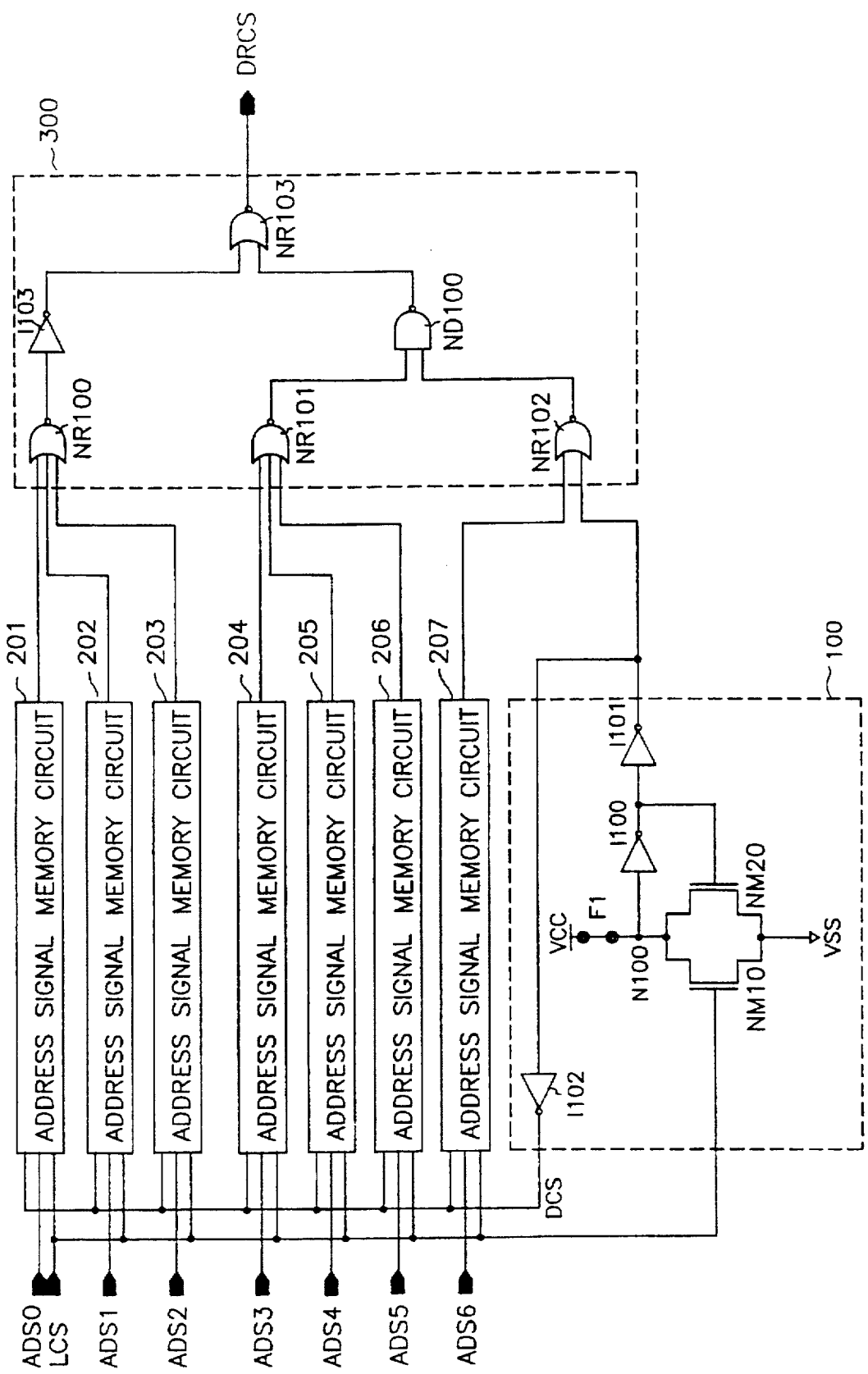
FIG. 3 is a circuit diagram of a data repair controller applied to the present invention.

Referring to FIG. 3, a driving control signal generator 100 generates a driving control signal DCS and an inverted driving control signal by a level control signal LCS applied from the exterior and an input signal according to the connection and disconnection of a fuse Fl. Each of address signal storage circuits 201–207 generates either a signal of a constant level irrespective of an address signal ADS after disabled by the driving control signal DCS generated from the driving control signal generator 100, or an inversion signal of a signal generated when disabled by storing address signals ADS0–ADS6 of a prescribed level by the level control signal LCS after enabled by the driving control signal DCS. A data repair control signal generator 300 generates a data repair control signal DRCS by the inverted driving control signal generated from the driving control signal generator 100 and the signals generated from the address signal storage signals 201–207.

The driving control signal generator 100 has NMOS transistors NM10 and NM20 for stabilizing a level of the input signal according to the connection and disconnection of the fuse F1 by the level control signal LCS applied from the exterior, inverters I100 and I101 for sequentially inverting a signal stabilized by the NMOS transistors NM10 and NM20, and an inverter I102 for generating the driving control signal DCS by inverting an output signal of the inverter I101.

The data repair control signal generator 300 includes a NOR gate NR100 for NORing signals generated from the address signal storage circuits 201–203, a NOR gate NR101 for NORing signals generated from the address signal storage circuits 204–206, a NOR gate NR102 for NORing a signal generated from the address signal storage circuit 207 and a signal generated from the inverter I101 of the driving control signal generator 100, an inverter I103 for inverting a signal generated from the NOR gate NR100, a NAND gate ND100 for NANDing signals generated from the NOR gates NR101 and NR102, and a NOR gate NR103 for NORing signals generated from the inverter I103 and the NAND gate ND100 to generate the data redundancy control signal DRCS.

Figure 4:
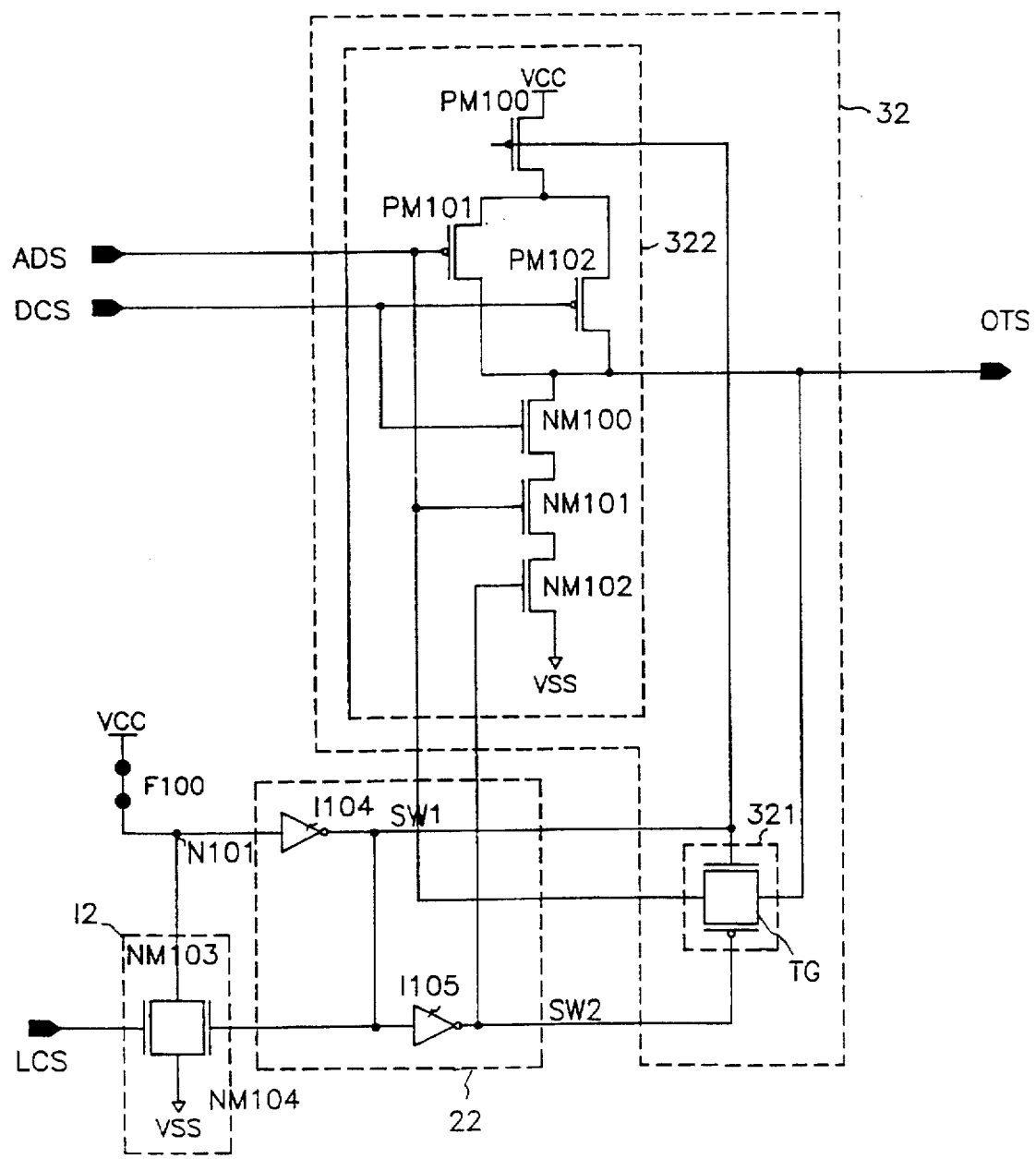
FIG. 4 is a circuit diagram of an address signal storage circuit of a data repair controller according to one embodiment of the present invention.

Referring to FIG. 4, there is shown the address signal storage circuit. A level stabilizer 12 stabilizes a level of an input signal by the level control signal LCS applied from the exterior according to the connection and disconnection of a fuse F100. A control signal generator 22 generates control signals SW1 and SW2 for storing the address signal ADS of a prescribed level by a signal stabilized by the level stabilizer 12. A signal storage portion 32 generates either a signal of a constant level by the control signal SW1 generated from the control signal generator 22 after disabled by the driving control signal DCS generated from the driving control signal generator 100, or an inversion signal of the signal generated when disabled by storing the address signal ADS of the prescribed level by the control signals SW1 and SW2 after enabled by the driving control signal DCS.

The level stabilizer 12 includes NMOS transistors NM103 and NM104 having respective drain electrodes commonly connected to one terminal of the fuse F100, respective gate electrodes respectively connected to the level control signal LCS and the control signal SW1 of the control signal generator 22, and respective source electrodes commonly connected to a ground voltage VSS terminal.

The control signal generator 22 has an inverter I104 for generating the control signal SW1 by inverting an input signal according to the connection and disconnection of the fuse F100, and an inverter I105 for generating the control signal SW2 by inverting the control signal SW1 generated from the inverter I104.

The signal storage portion 32 has a signal output circuit 321 consisting of a transmission gate TG switched by the control signals SW1 and SW2 generated from the control signal generator 22 to generate the address signal ADS of the prescribed level, and another signal output circuit 322 for generating either a constant signal by the control signal SW1 generated from the control signal generator 22 after disabled by the driving control signal DCS, or an inverted address signal by the control signal SW1 after enabled by the driving control signal DCS.

In the signal output circuit 322, a PMOS transistor PM100 has a source electrode connected to a power voltage VCC terminal, and a gate electrode connected to the control signal SW1 of the control signal generator 22. PMOS transistors PM101 and PM102 have respective source electrodes commonly connected to a drain electrode of the PMOS transistor PM100, and respective gate electrodes respectively connected to the address signal ADS and the driving control signal DCS of the driving control signal generator 100. An NMOS transistor NM100 has a drain electrode commonly connected to respective drain electrodes of the PMOS transistors PM101 and PM102, and a gate electrode connected to the gate electrode of the PMOS transistor PM102. An NMOS transistor NM101 has a drain electrode connected to a source electrode of the NMOS transistor NM100, and a gate electrode connected to the gate electrode of the PMOS transistor PM101. An NMOS transistor NM102 has a drain electrode connected to a source electrode of the NMOS transistors NM101, a gate electrode connected to the control signal SW2 of the control signal generator 22, and a source electrode connected to the ground voltage VSS terminal.

The operation of the address signal storage circuit of FIG. 4 will now be described in detail.

In order to control the data repair operation of the redundancy circuit to be disabled, the fuse F1 shown in FIG. 3 is externally controlled to be connected. Then the NMOS transistor NM10 of the driving control signal generator 100 receives through the gate electrode the level control signal LCS of logic "low" applied from the exterior and is turned off. A node N100 is set to logic "high", and the logic "high" signal is sequentially applied to the inverters I100, I101 and I102. The inverter I102 generates the driving control signal DCS of logic "low".

The fuse F100 in the address signal storage circuits 201-207 is externally controlled to be connected. The NMOS transistor NM103 of the level stabilizer 12 shown in FIG. 4 is turned off by the level control signal LCS of logic "low" and a node N101 is set to logic "high". The inverter I104 receiving the logic "high" signal across the node N101 generates the control signal SW1 of logic "low", and the inverter I105 generates the control signal SW2 of logic "high".

Since the control signal SW1 of logic "low" generated from the inverter I104 of the control signal generator 22 is applied to the gate electrode of the PMOS transistor PM100, the PMOS transistor PM100 is turned on. The PMOS transistor PM102 with the gate electrode receiving the driving control signal DCS of logic "low" generated from the inverter I102 of the driving control signal generator 100 is turned on. Then an output signal OTS of logic "high" is generated.

The NOR gate NR100 of the data repair control signal generator 300 receiving each output signal OTS of logic "high" from the address signal storage circuits 201-203 generates a logic "low" signal. The NOR gate NR101 receiving each output signal OTS of logic "high" from the address signal storage circuits 204-206 generates a logic "low" signal. The NOR gate NR102 receiving the output signal OTS of logic "high" from the address signal storage circuit 207 and a signal of logic "high" from the inverter I101 of the driving control signal generator 100 generates a logic "low" signal. The inverter I103 receiving the logic "low" signal generated from the NOR gate NR1OO generates a logic "high" signal. The NAND gate ND100 receiving the "low" signals generated from the NOR gates NRlOl and NR102 generates a logic "high" signal. The NOR gate NR103 receiving the logic "high" signals from the inverter I103 and the NAND gate ND100 generates the data repair control signal DRCS of logic "low". Therefore, the redundancy circuit is disabled by the data repair control signal DRCS of logic "low" generated from the NOR gate NR103.

Meanwhile, in order to control the data repair operation of the redundancy circuit to be enabled, the fuse F1 is externally controlled to be shorted. The NMOS transistor NM10 of the driving control signal generator 100 receives through the gate electrode the level control signal LCS of logic "high" applied from the exterior and is turned on. Then the node N100 is set to logic "low" and this logic "low" signal is sequentially applied to the inverters I100, I101 and I102. The inverter I102 generates the driving control signal DCS of logic "high".

If the fuse F100 in the address signal storage circuits 201-207 is in the connected state, the NMOS transistor NM103 of the level stabilizer 12 is turned off by the level control signal LCS of logic "low" and the node N101 is set to logic "high". The inverter I104 of the control signal generator 22 receiving the logic "high" signal across the node N101 generates the control signal SW1 of logic "low", and the inverter I105 generates the control signal SW2 of logic "high".

Since the control signal SW1 of logic "low" generated from the inverter I104 of the control signal generator 22 is applied to the gate electrode of the PMOS transistor PMlOO of the signal output circuit 322, the PMOS transistor PM100 is turned on. The PMOS transistor PM101 and the NMOS transistor NM101 receiving through the respective gate electrodes the address signal ADS of logic "high" are turned off and turned on, respectively.

The PMOS transistor PM102 and the NMOS transistor NM100 with the respective gate electrodes receiving the driving control signal DCS of logic "high" generated from the inverter I102 of the driving control signal generator 100 are turned off and turned on, respectively. The NMOS transistor NM102 with the gate electrode receiving the control signal SW2 of logic "high" generated from the inverter I105 is turned on. Therefore, the signal output circuit 322 generates the output signal OTS of logic "low" which is an inversion signal of the address signal ADS of logic "high".

If the fuse F100 is controlled to be shorted, the NMOS transistor NM103 of the level stabilizer 12 is turned on by the level control signal LCS of logic "high" and the node N101 is set to logic "low". The inverter I104 of the control signal generator 22 receiving the logic "low" signal across the node N101 generates the control signal SW1 of logic "high", and the inverter I105 generates the control signal SW2 of logic "low".

The transmission gate TG with an NMOS terminal receiving the control signal SW1 of logic "high" and a PMOS terminal receiving the control signal SW2 of logic "low" are turned on. Therefore, the input address signal ADS of logic "low" is generated as the output signal OTS.

The NOR gate NR100 of the data repair control signal generator 300 receives each output signal OTS of logic "low" from the address signal storage circuits 201-203 and generates a logic "high" signal. The inverter I103 receiving the logic "high" signal generates a logic "low" signal. The NOR gate NR101 receiving each output signal OTS of logic "low" from the address signal storage circuits 204-206 generates a logic "high" signal. The NOR gate NR102 receiving the output signal OTS of logic "low" from the address signal storage circuit 207 and a logic "low" signal from the inverter I101 of the driving control signal generator 100 generates a logic "high" signal. The NAND gate ND100 receives the logic "high" signals from the NOR gates NR101 and NR102 and generates a logic "low" signal. The NOR gate NR103 receiving the logic "low" signals from the inverter I103 and the NAND gate ND100 generates the data repair control signal DRCS of logic "high". Therefore, the redundancy circuit is enabled by the data repair control signal DRCS of logic "high" generated from the NOR gate NR103, to carry out the data repair operation.

That is, in order to control the data repair operation of the redundancy circuit to be enabled, the address signal ADS of logic "low" is stored by shorting the fuse F100, and the address signal ADS of logic "high" is stored by connecting the fuse F100.

Figure 5:
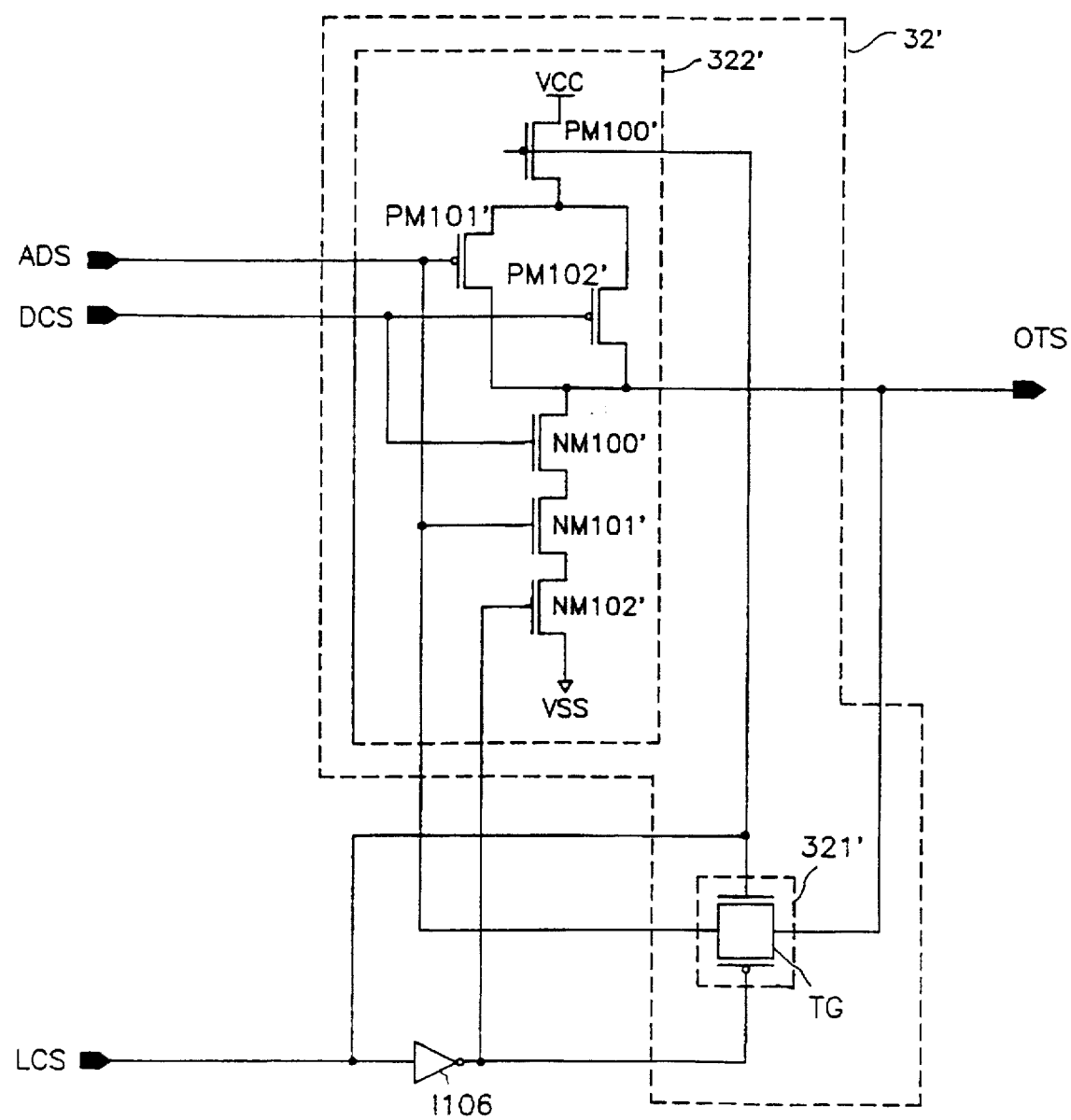
FIG. 5 is a circuit diagram of an address signal storage circuit of a data repair controller according to another embodiment of the present invention.

Referring to FIG. 5, another example of the address signal storage circuits 201–207 is shown. A signal storage portion 32' generates a signal of a constant level by the level control signal LCS irrespective of the input address signal ADS after disabled by the driving control signal DCS generated from the driving control signal generator 100, or stores the address signal ADS of a prescribed level by the level control signal LCS and an inverted level control signal after enabled by the driving control signal DCS. In the signal storage portion 32', a signal output circuit 321' includes a transmission gate TG' switched by the level control signal LCS and the inverted level control signal which has passed through an inverter I106 to generate the input address signal ADS. A signal output circuit 322' generates either a constant signal by the level control signal LCS after disabled by the driving control signal DCS generated from the driving control signal generator 100, or an inverted address signal by the level control signal LCS after enabled by the driving control signal DCS.

In the signal output circuit 322', a PMOS transistor PM100' has a source electrode connected to the power voltage VCC terminal, and a gate electrode connected to the level control signal LCS. PMOS transistors PM101' and PM102' have respective source electrodes commonly connected to a drain electrode of the PMOS transistor PM100', and respective gate electrodes respectively connected to the address signal ADS and the driving control signal DCS of the driving control signal generator 100. An NMOS transistor NM100' has a drain electrode commonly connected to respective drain electrodes of the PMOS transistors PM101' and PM102', and a gate electrode connected to the gate electrode of the PMOS transistor PM102'. An NMOS transistor NM101' has a drain electrode connected to a source electrode of the NMOS transistor NM100', and a gate electrode connected to the gate electrode of the PMOS transistor PM101'. An NMOS transistor NM102' has a drain electrode connected to a source electrode of the NMOS transistors NM101', a gate electrode connected to an output terminal of the inverter I106, and a source electrode connected to the ground voltage VSS terminal.

The operation of the address storage circuit of FIG. 5 will now be described in detail.

If the data repair operation of the redundancy circuit is controlled to be disabled, the driving control signal generator 100 shown in FIG. 4 generates the driving control signal DCS of logic "low", as described above. Then the PMOS transistor PM100' of the signal output circuit 322' receives through the gate electrode the level control signal LCS of logic "low" and is turned on. The PMOS transistor PM102' receiving through the gate electrode the driving control signal DCS, of logic "low" is turned on. Therefore, the output signal OTS of logic "high" is generated. The data repair control generator 300 receives each output signal OTS of logic "high" from the address signal storage circuits 201–207 and generates the data repair control signal DRCS of logic "low", thereby disabling the redundancy circuit.

When the data repair operation of the redundancy circuit is controlled to be enabled, if the level control signal LCS applied from the exterior is logic "low", the address signal ADS of logic "high" is stored. If the level control signal LCS is logic "high", the address signal ADS of logic "low" is stored.

That is, if the level control signal LCS supplied from the exterior is logic "low", the PMOS transistor PM100' is turned on. The PMOS transistor PM101' and the NMOS transistor NM101' with the respective gate electrodes receiving the address signal ADS of logic "high" are turned off and turned on, respectively. The PMOS transistor PM102' and the NMOS transistor NM100' with the respective gate electrodes receiving the driving control signal DCS of logic "high" are turned off and turned on, respectively. The NMOS transistor NM102' with the gate electrode receiving the inverted level control signal is turned on and the output signal OTS of logic "low" is generated.

If the level control signal LCS of logic "high" is applied, the transmission gate TG' with an NMOS terminal receiving the level control signal LCS of logic "high" and a PMOS terminal receiving the inverted level control signal of logic "low" is turned on and the address signa ADS of logic "low" is generated as the output signal OTS. Therefore, the data repair control signal generator 300 receives each output signal of logic "low" from the address storage circuits 201–207 and generates the data repair control signal DRCS of logic "high", thereby enabling the redundancy circuit.

Therefore, the address signal ADS of logic "low" is stored by the level control signal LCS of logic "high", and the address signal ADS of logic "high" is stored by the level control signal LCS of logic "low".

Figure 6:
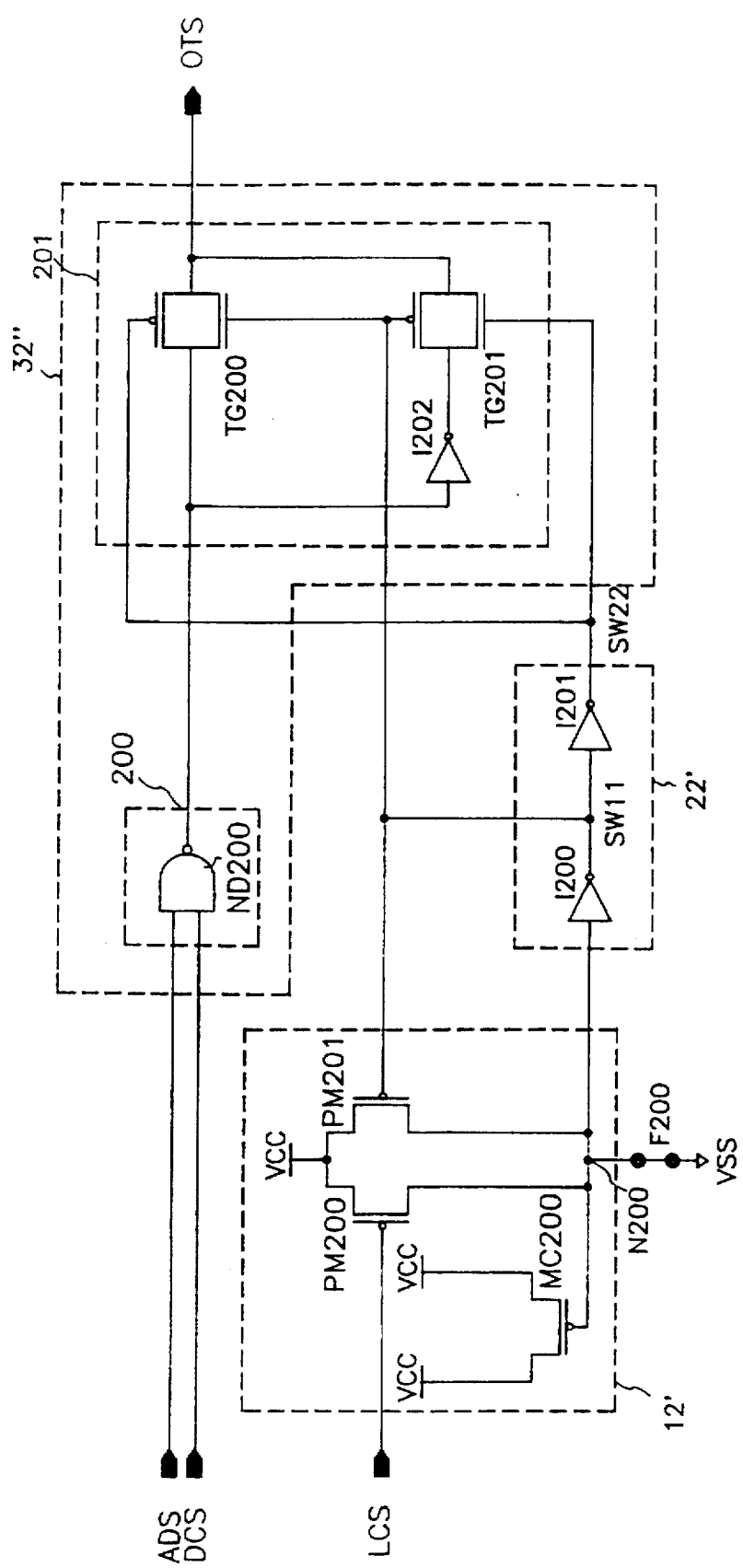
FIG. 6 is a circuit diagram of an address signal storage circuit of a data repair controller according to still another embodiment of the present invention.

FIG. 6 shows a further example of the address signal storage circuit. A level stabilizer 12' stabilizes a level of an output signal by the level control signal LCS applied from the exterior when a fuse f200 is shorted. A control signal generator 22' generates control signals SW11 and SW22 by an output signal of the level stabilizer 12' according to the connection and disconnection of the fuse f200. A signal storage portion 32" generates either a signal of a constant level by the control signals SW11 and SW22 generated from the control signal generator 22' after disabled by the driving control signal DCS generated from the driving control signal generator 100, or an inversion signal of the signal generated when disabled by storing the address signal ADS of a prescribed level by the control signals SW11 and SW22 after enabled by the driving control signal DCS.

In the level stabilizer 12', PMOS transistors PM200 and PM201 have respective source electrodes commonly connected to the power voltage VCC terminal, respective gate electrodes respectively connected to an input line of the level control signal LCS and the control signal SW11 of the control signal generator 22', and respective drain electrodes commonly connected to one terminal of the fuse f200. A PMOS condenser MC200 have a gate electrode commonly connected to the respective drain electrodes of the PMOS transistors PM200 and PM201, and source and drain electrodes commonly connected to the power voltage VCC terminal.

The control signal generator 22' has an inverter I200 for generating the control signal SW11 by inverting a signal stabilized by the level stabilizer 12', and an inverter I201 for generating the control signal SW22 by inverting the control signal SW11 generated from the inverter I200.

In the signal storage portion 32", a level converter 200 has a NAND gate ND200 for generating either a signal of a constant level irrespective of the address signal ADS by the driving control signal DCS, or an inverted address signal by the driving control signal DCS. A signal output circuit 201 is switched by the control signals SW11 and SW22 to generate either an output signal of the level converter 200, or an inversion signal of the output signal of the level converter 200.

The signal output circuit 201 has a transmission gate TG200 switched by the control signals SW11 and SW22 to generate the signal generated from the level converter 200.

and a transmission gate TG201 switched by the control signals SW11 and SW22 to generate an inversion signal of the output signal of the level converter 200.

Hereinafter, the operation of the address storage circuit of FIG. 6 will be described in detail.

In order to control the data repair operation of the redundancy circuit to be disabled, if the fuse F1 shown in FIG. 3 is controlled to be in the connected state, the driving control signal DCS of logic "low" is generated. If the fuse f200 is externally controlled to be connected, a node N200 is set to logic "low". The inverter I200 of the control signal generator 22' generates the control signal SW11 of logic "high" and the inverter I201 generates the control signal SW22 of logic "low". The NAND gate ND200 of the level converter 200 receives the driving control signal of logic "low" generated from the driving control signal generator 100 and the address signal ADS, and generates a logic "high" signal. The transmission gate TG200 with a PMOS terminal receiving the control signal SW22 of logic "low" and an NMOS terminal receiving the control signal SW11 of logic "high" is turned on, and the logic "high" signal is generated from the NAND gate ND200 of the level converter.

In order to control the data repair operation of the redundancy circuit to be enabled, if the fused F1 is controlled to be shorted, the driving control signal generator 100 generates the driving control signal DCS of logic "high".

If the fuse f200 is externally controlled to be connected, the transmission gate TG200 is turned on, as described above. The NAND gate ND200 receiving the address signal ADS of logic "high" and the driving control signal DCS of logic "high" generates a logic "low" signal. This logic "low" signal is generated as the output signal OTS through the transmission gate TG200.

If the fuse f200 is in the shorted state, the node N200 is set to logic "high" by the PMOS transistors PM200 and PM201 and the PMOS condenser MC200. The inverter I200 generates the control signal SW11 of logic "low", and the inverter I201 generates the control signal SW22 of logic "high". The transmission gate TG201 with a PMOS terminal receiving the control signal SW11 of logic "low" and an NMOS terminal receiving the control signal SW22 of logic "high" are turned on. The NAND gate ND200 receiving the address signal ADS of logic "low" and the driving control signal DCS of logic "high" generates a logic "high" signal. This logic "high" signal generated from the NAND gate ND200 is inverted by the inverter I202. Therefore, a logic "low" signal is generated as the output signal OTS through the transmission gate TG201. Then, the data repair control signal generator 300 receives each output signal of logic "low" from the address storage circuits 201–207 and generates the data repair control signal DRCS of logic "high", thereby enabling the redundancy circuit.

Consequently, in order to enable the data repair operation of the redundancy circuit, if the fuse f200 is connected, the address signal ADS of logic "high" is stored, and if the fuse f200 is shorted, the address signal ADS of logic "low" is stored.

In conclusion, the inventive address storage circuit of the data repair controller is disabled by an external control signal irrespective of the address signal of the prescribed level applied, in order to control the data repair operation of the redundancy circuit to be disabled. Therefore, the current dissipated when enabled is reduced and the power consumption decreases. Further, since only one fuse is used to store the address signal, the capacity of the circuit is reduced, and since a signal across the shorted node is stabilized, the operation of the address storage circuit can be stably implemented.

What is claimed is:

1. An address signal storage circuit of a data repair controller, comprising:

level stabilizing means for stabilizing a level of first signal based on an externally applied level control signal, wherein the stabilized first signal corresponds to the connection and disconnection of a first fuse;

control signal generating means for generating first and second control signals based on the stabilized first signal from said level stabilizing means;

signal storage means for generating an output signal being either a signal of a constant level by said first control signal generated from said control signal generating means and an externally applied driving control signal, or an inversion signal of an address signal of a prescribed level based on said first and second control signals and said driving control signal; and a driving control signal generator that generates said driving control signal based on a stabilized second signal and the level control signal.

2. An address signal storage circuit of a data repair controller as claimed in claim 1, wherein said level stabilizing means comprises:

first and second NMOS transistors having respective drain electrodes commonly connected to one terminal of said fuse, respective gate electrodes connected to said level control signal and said first control signal of said control signal generating means, and respective source electrodes commonly connected to a ground voltage terminal.

3. An address signal storage circuit of a data repair controller as claimed in claim 1, wherein said control signal generating means comprises:

a first inverter for generating said first control signal by inverting said stabilized first signal; and a second inverter for generating said second control signal by inverting said first control signal generated from said first inverter.

4. An address signal storage circuit of a data repair controller as claimed in claim 1, wherein said signal storage means comprises:

first signal output means for generating said output signal being said address signal of the prescribed level, said first signal output means being controlled by said first and second control signals generated from said control signal generating means; and second signal output means for generating either said constant level output signal based on said first control signal generated from said control signal generating means and a disabling driving control signal, or said inversion signal of said address signal based on said second control signal and an enabling driving control signal.

5. An address signal storage circuit of a data repair controller as claimed in claim 4, wherein said second signal output means comprises:

a first PMOS transistor having a source electrode connected to a power voltage terminal, and a gate electrode connected to said first control signal of said control signal generating means;

second and third PMOS transistors having respective source electrodes commonly connected to a drain electrode of said first PMOS transistor, and respective gate electrodes connected to said address signal and said enabling and disabling driving control signals;

a first NMOS transistor having a drain electrode commonly connected to respective drain electrodes of said second and third PMOS transistors, and a gate electrode connected to the gate electrode of said third PMOS transistor;

a second NMOS transistor having a drain electrode connected to a source electrode of said first NMOS transistor, and a gate electrode connected to the gate electrode of said second PMOS transistor; and a third NMOS transistor having a drain electrode connected to a source electrode of said second NMOS transistor, a gate electrode connected to said second control signal of said control signal generating means, and a source electrode connected to a ground voltage terminal.

6. An address signal storage circuit of a data repair controller as claimed in claim 1, wherein said signal storage means comprises:

level converting means for generating said output signal being either said constant level signal based on said driving control signal irrespective of said address signal, or said inverted address signal by said driving control signal; and signal output means for generating said output signal generated from said level converting means, or an inversion signal of the output signal generated from said level converting means, said signal output means being controlled by said first and second control signals.

7. An address signal storage circuit of a data repair controller as claimed in claim 6, wherein said signal output means comprises:

a first transmission gate for generating the output signal generated from said level converting means; and a second transmission gate for generating the inversion signal of the output signal generated from said level converting means, said first and second transmission gates being switched by said first and second control signals generated from said control signal generating means.

8. An address signal storage circuit of a data repair controller as claimed in claim 1, wherein said driving control signal generator comprises:

two transistors for stabilizing the stabilized second signal having respective drains coupled together for connection to a second fuse, respective gate electrodes that receive the level control signal and an inverted signal of the stabilized second signal, and respective source electrodes coupled to a ground potential, wherein the stabilized second signal corresponds to the connection and disconnection of the second fuse; and at least one inverter for inverting the stabilized second signal to generate the driving control signal.

9. An address signal storage circuit of a data repair controller, comprising:

a plurality of storage circuits, wherein each of the storage circuits comprises, a level stabilizing unit that generates a first signal based on an externally applied level control signal, wherein a level of the first signal corresponds to the connection and disconnection of a first fuse, a control signal generating unit that generates first and second control signals based on the first signal from said level stabilizing unit, and a signal storage unit that generates an output signal being either a signal of a constant level based on said first control signal generated from said control signal generating unit and a driving control signal, or an inversion signal of an address signal of a prescribed level based on said first and second control signals and said driving control signal; and a driving control signal generator that generates said driving control signal based on a second signal and the level control signal, wherein a level of the second signal corresponds to the connection and disconnection of a second fuse.

10. An address signal storage circuit of a data repair controller as claimed in claim 9, wherein said driving control signal generator comprises:

two transistors for stabilizing the second signal having respective drains coupled together for connection to the second fuse, respective gate electrodes that receive the level control signal and an inverted signal of the second signal, and respective source electrodes coupled to a ground potential; and at least one inverter for inverting the second signal to generate the driving control signal.

11. An address signal storage circuit of a data repair controller as claimed in claim 10, wherein said signal storage unit comprises:

a first signal output unit that generates said output signal being said address signal of the prescribed level, said first signal output unit being controlled by said first and second control signals generated from said control signal generating unit; and a second signal output unit that generates either said constant level output signal based on said first control signal generated from said control signal generating unit and a disabling driving control signal, or said inversion signal of said address signal based on said second control signal and an enabling driving control signal.

* * * * *

UNITED STATES PATENT AND TRADEMARK OFFICE
CERTIFICATE OF CORRECTION

PATENT NO : 5,796,663
DATED : August 18, 1998
INVENTOR(S): Jong Hoon Park, Tae Hyung Jung It is certified that error appears in the above-identified patent and that said Letters Patent is hereby corrected as shown below:

Title page, item
[30] Foreign Application Priority Data change "1995/248723" to --1995/48723--.

Signed and Sealed this

Thirtieth Day of May, 2000

Attest:

Q. TODD DICKINSON

Attesting Officer

Director of Patents and Trademarks